(12) United States Patent
Primavera et al.

(10) Patent No.: US 7,205,486 B2
(45) Date of Patent: Apr. 17, 2007

(54) THERMALLY ISOLATED VIA STRUCTURE

(75) Inventors: Anthony Primavera, Anoka, MN (US); Steven P. Findell, New Brighton, MN (US)

(73) Assignee: Cardiac Pacemakers, Inc., St. Paul, MN (US)

( * ) Notice: Subject to any disclaimer, the term of this patent is extended or adjusted under 35 U.S.C. 154(b) by 52 days.

(21) Appl. No.: 10/892,648

(22) Filed: Jul. 16, 2004

(65) Prior Publication Data

US 2006/0012027 A1  Jan. 19, 2006

(51) Int. Cl.
*H01L 23/48* (2006.01)
(52) U.S. Cl. .................. 174/266; 257/758; 257/774; 257/E23.01
(58) Field of Classification Search ................ 174/266; 257/758, 774, E23.01–E23.022, 174
See application file for complete search history.

(56) References Cited

U.S. PATENT DOCUMENTS

| | | | |
|---|---|---|---|
| 3,916,513 A * | 11/1975 | Ballard | 29/827 |
| 4,494,083 A * | 1/1985 | Josefsson et al. | 333/33 |
| 5,218,759 A * | 6/1993 | Juskey et al. | 29/840 |
| 5,576,518 A * | 11/1996 | Shibuya et al. | 174/264 |
| 6,856,023 B2 * | 2/2005 | Muta et al. | 257/774 |
| 6,881,994 B2 * | 4/2005 | Lee et al. | 257/296 |
| 6,890,828 B2 * | 5/2005 | Horak et al. | 438/319 |
| 2003/0056981 A1 * | 3/2003 | Furukuwa | 174/258 |
| 2004/0176669 A1 * | 9/2004 | Colvin, Jr. | 600/316 |
| 2004/0230267 A1 * | 11/2004 | Wenger | 607/116 |

* cited by examiner

*Primary Examiner*—Marcos D. Pizarro
(74) *Attorney, Agent, or Firm*—Schwegman, Lundberg, Woessner, & Kluth, P.A.

(57) ABSTRACT

This document discusses, among other things, a flexible circuit or other laminate comprising a first conductive layer and a second conductive layer disposed over the first conductive layer. An insulator is disposed between the first and second conductive layers. A conductive via extends through the insulator and electrically connects the first and second conductive layers. The laminate includes a channel in the insulator. In one option, the channel extends at least part way around the via. In another option, the channel extends at least part way between the first and second conductive layers. In another example, a method comprises providing a laminate including at least first and second conductive layers and an insulator disposed therebetween. A via is formed through the insulator. A channel is formed in the insulator at least part way around the via. The channel extends between the first and second conductive layers.

27 Claims, 5 Drawing Sheets

THERMALLY ISOLATED VIA STRUCTURE

TECHNICAL FIELD

This document relates generally to circuit boards and in particular to conductive vias.

BACKGROUND

Cardiac rhythm management (CRM) devices such as pacers, cardioverters, defibrillators, cardiac resynchronization therapy (CRT) devices, as well as combination devices typically include flexible printed circuit boards. A printed circuit board is a laminate of dielectric layers sandwiching layers of conductive circuits. Conductive vias extend through the dielectric layers to electrically couple the circuits of different layers. The dielectric layers often have higher coefficients of expansion compared to the conductive materials used in the vias. The vias expand less in the presence of heat (e.g., heat from manufacturing processes or circuit operation) or moisture relative to the insulation material used in the dielectric layers. Moreover, the dielectric materials sometimes include fibers or the like. The dielectric layers expand more in directions orthogonal to these fibers and often expand in a direction substantially parallel to the vias.

Expansion of the dielectric layers applies stress along the less expansion prone vias. The stress is typically focused at the junctures between the vias and their contacts to the conductive layers on the circuit boards. Sufficient stress due to expansion of the dielectric material separates the vias from such conductive contacts. This can reduce circuit performance or even cause an electrical open circuit that can ruin the circuit board. Additionally, separation of the vias and contacts in manufacturing requires discarding of the affected circuit boards. This increases manufacturing costs. The present inventors have recognized an unmet need for reducing stress on conductive vias to avoid, for example, circuit board failure and to improve manufacturing quality.

DESCRIPTION OF THE EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural changes may be made without departing from the scope of the present invention. Therefore, the following detailed description is not to be taken in a limiting sense, and the scope of the present invention is defined by the appended claims and their equivalents.

Figure 1:
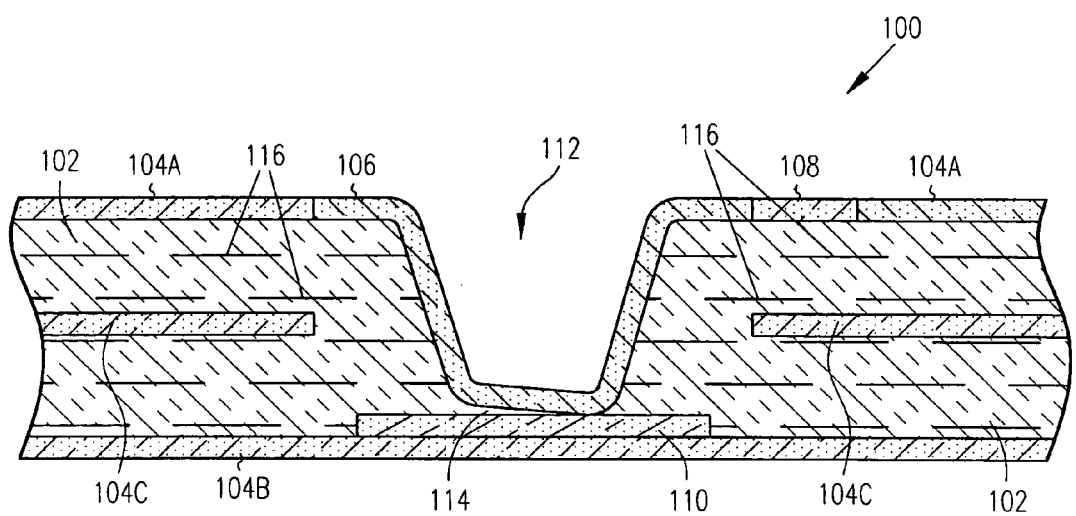
FIG. 1 is a sectional view illustrating a portion of a circuit board laminate.

FIG. 1 is a sectional view of a laminate 100, for instance a flexible or other circuit board. The laminate 100 includes insulating layers 102 and conductive layers 104. In the example shown in FIG. 1, the laminate 100 includes conductive layers 104A–C. The insulating layers 102 interpose the conductive layers 104A–C. In one example, the insulating layers 102 include a dielectric such as polyimide or the like. In another example, the conductive layers 104A–C include a conductive material, for instance, copper or the like. The conductive layers 104A–C and insulating layers 102 are coupled together with heat, adhesives or the like. At least one conductive via 106 extends at least part way through the laminate 100 to electrically couple the conductive layers 104A, 104B. The conductive via 106, in one example, includes a conductive material such as copper. In another example, the via 106 is coupled to conductive layer 104A with a trace 108. The trace 108 extends between the conductive layer 104A and the via 106 to provide an electrical contact between the via 106 and the conductive layer 104A. The conductive layer 104B is coupled to the via 106 either directly or with a pad 110, in yet another example. The conductive pad 110 provides an electrical contact that electrically couples the conductive layer 104B with the via 106.

The via 106 is disposed within a cavity 112. The cavity 112 is sized and shaped to extend between the conductive layers 104A, 104B and through the intervening insulating layers 102. Typically, the via 106 is plated between the conductive layers 104A, 104B to form one electrical connection between the conductive layers 104A, 104B. In another example, the via 106 electrically connects more than two conductive layers, for instance conductive layers 104A–C. The via 106 typically is plated around the inner surface of the cavity 112 and is along one or more of the insulating layers 102.

Relative to the conductive layers 104A–C and the via 106, the insulating layers 102 expand more when the laminate 100 is exposed to processing conditions such as heat, moisture, chemical solutions or the like. Additionally, the insulating layers 102 may expand when the conductive layers 104A–C receive electricity and thereby generate heat, for instance, during fabrication, testing, pacing, defibrillation, or the like. As described above, the insulating layers include, in one example, a dielectric (e.g., polyimide). Such a dielectric, typically has a thermal coefficient of expansion of approximately 30 to 200 ppm/degree C. The conductive material (e.g., copper) used in the via 106 and the conductive layers 104A–C typically has a lower thermal coefficient of expansion, for instance, approximately 17 ppm/degree C.

During fabrication of the laminate 100, for example, temperatures can reach approximately 225 to 240 degrees Celsius to fuse the conductive layers 104A–C to the insulating layers 102. The laminate 100 may also experience increased temperatures when electrical power is applied to the conductive layers 104A–C (e.g. pacing, defibrillation, testing or the like). The insulating layers 102 expand more than the conductive material of the via 106. Because of the differences in thermal expansion of the insulating layers 102 and the conductive material in the via 106 expansion of the insulating layers 102 tends to pull the via 106 away from the pad 110. The stresses at the point of coupling between the pad 110 and the via 106, in one example, can tear the via 106 away from contact with the pad 110, thereby increasing the electrical resistance of the via. In another example, the stresses partially pull the via 106 out of contact with the pad 110. Typically, separation of the via 106 from the pad 110 creates a gap 114. The gap 114, in one example, prevents electrical communication between the via 106 and the pad 110 and therefore prevents electrical communication between the conductive layers 104A, 104B. In another example, the gap 114 is small enough that at least a portion of the via 106 and the pad 110 remain in contact. The gap 114 can widen and sever the connection between the via 106 and the pad 110 with age, additional power cycling, or processing steps.

In another example, the insulating layers 102 include a composite dielectric material. The composite dielectric typically includes fibers 116 extending in a plane substantially parallel to the conductive layers 104A–C. Heat or chemical solutions cause the insulating layers 102 to expand to a greater degree in a direction orthogonal to the plane of the fibers 116 and to a lesser degree in a direction parallel to the plane of the fibers 116. In one example, the insulating layers 102 expand in a direction substantially parallel to the via 106. This increases the stress on the juncture between the via 106 and the pad 110 and can pull the via 106 out of contact with the pad 110.

The insulating layers 102 also expand when exposed to wet cleaning solutions. The materials of the insulating layers 102 absorb moisture and swell. The conductive material of the via 106 absorbs less moisture and does not expand to the same degree as the insulating layers 102. Moisture induced stress at the juncture between the via 106 and the pad 110 is on the same order as that of the thermal expansion. The via 106, in one example, is torn or partially separated from the pad 110 as shown by the gap 114.

Figure 2:
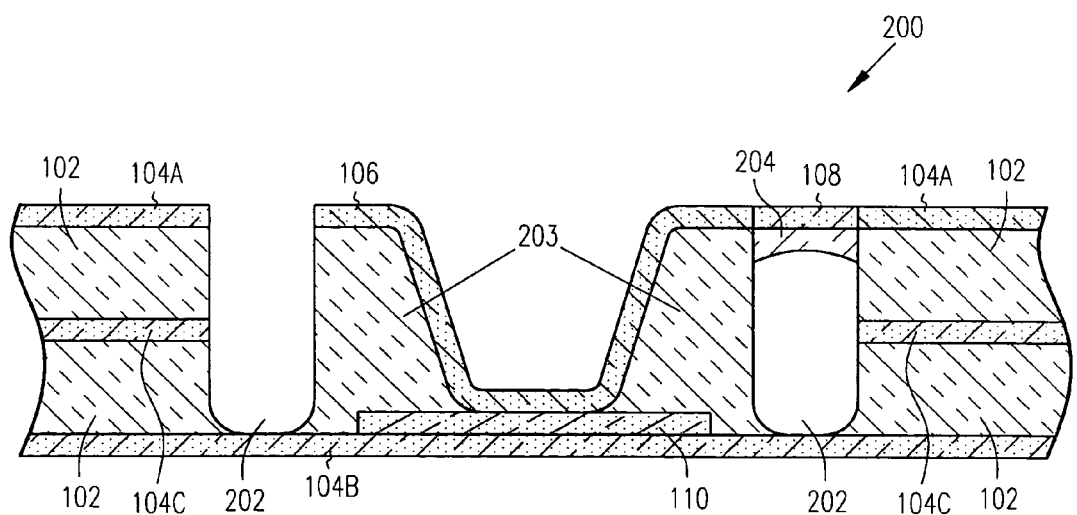
FIG. 2 is a sectional view illustrating a portion of a circuit board laminate including a channel around a conductive via.

FIG. 2 is a sectional view of a laminate 200, for instance a flexible or other circuit board constructed with similar components as the laminate 100, described above. In this example, however, the laminate 200 includes a channel 202 extending at least part way around the via 106. In one example, the channel 202 extends between the conductive layers 104A, 104B. In another example, the channel 202 extends the entire distance between the conductive layers 104A, 104B. The channel 202 extends around the via 106 and between the conductive layers 104A, 104B, in an example, far enough to reduce mechanical stress on the electrical connection between the via 106 and the pad 110 coupled to the conductive layer 104B due to swelling of the insulator. The mechanical stress is reduced enough to preserve electrical connectivity of the first and second conductive layers 104A, 104B by the via 106 in spite of the dielectric swelling, in another example, as described below. The channel 202 is typically formed in the laminate 200 by plasma etching, chemical etching, laser machining, or the like. In one example, a small amount of insulating material 203 is left underneath a rim of the via 106. The channel 202 substantially isolates the via 106 from the insulating layers 102. This substantially prevents stress and resulting separation of the via 106 from the pad 110 caused by expansion of the insulating layers 102. As a result, the via 106 experiences little or no stress that would pull it out of contact with the pad 110. The channel 202 substantially separates the via 106 from the insulating layers 102 and allows the via 106 to remain in electrical contact with the conductive layers 104A, 104B during expansion of the insulating layers 102.

Figure 3:
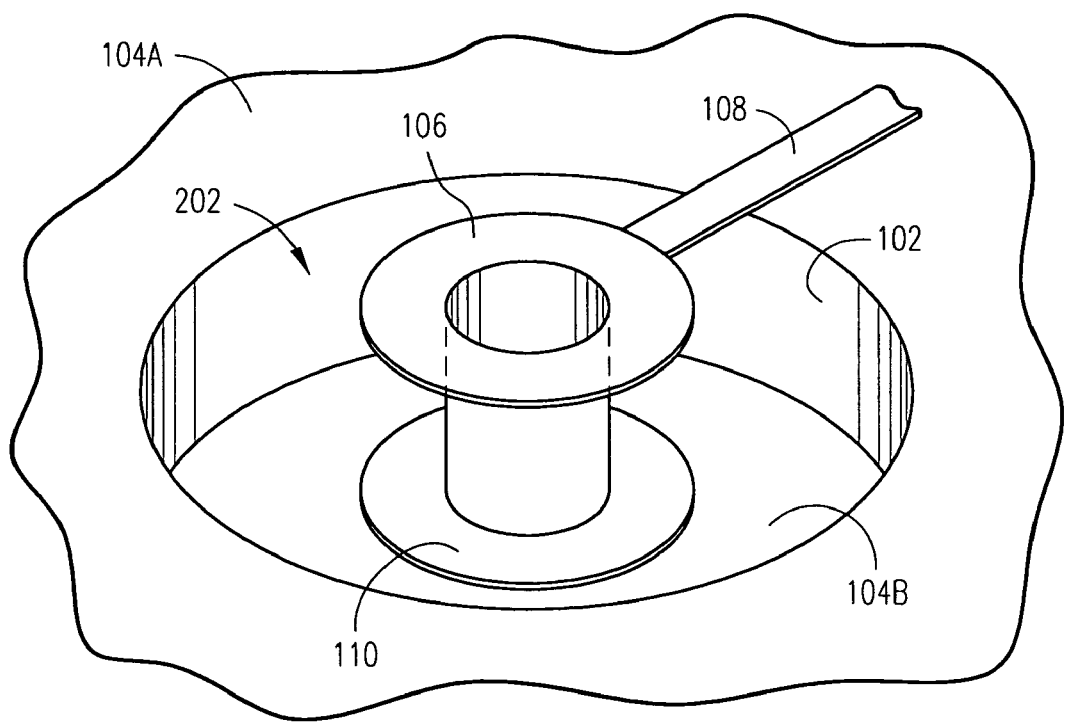
FIG. 3 is a perspective view illustrating a portion of a circuit board laminate including a channel around a conductive via.

FIG. 2 and FIG. 3 illustrate the trace 108 that electrically couples the via 106 to the conductive layer 104A. In one example, as shown in FIG. 2, the trace 108 bridges the channel 202. In another example, multiple traces 108 extend from the via 106 and provide electrical contact between the via 106 and at least one of the conductive layers such as conductive layer 104A and other additional conductive layers. In yet another example, some residue insulating material 204, remains beneath the trace 108 and extends toward the conductive layer 104B. The insulating material, optionally extends between the trace 108 and the conductive layer 104B. Expansion of the remaining insulating material 204 does not provide sufficient stress to separate the via 106 from the pad 110 because the insulating material 204 does not extend far enough around the via 106.

Figure 4:
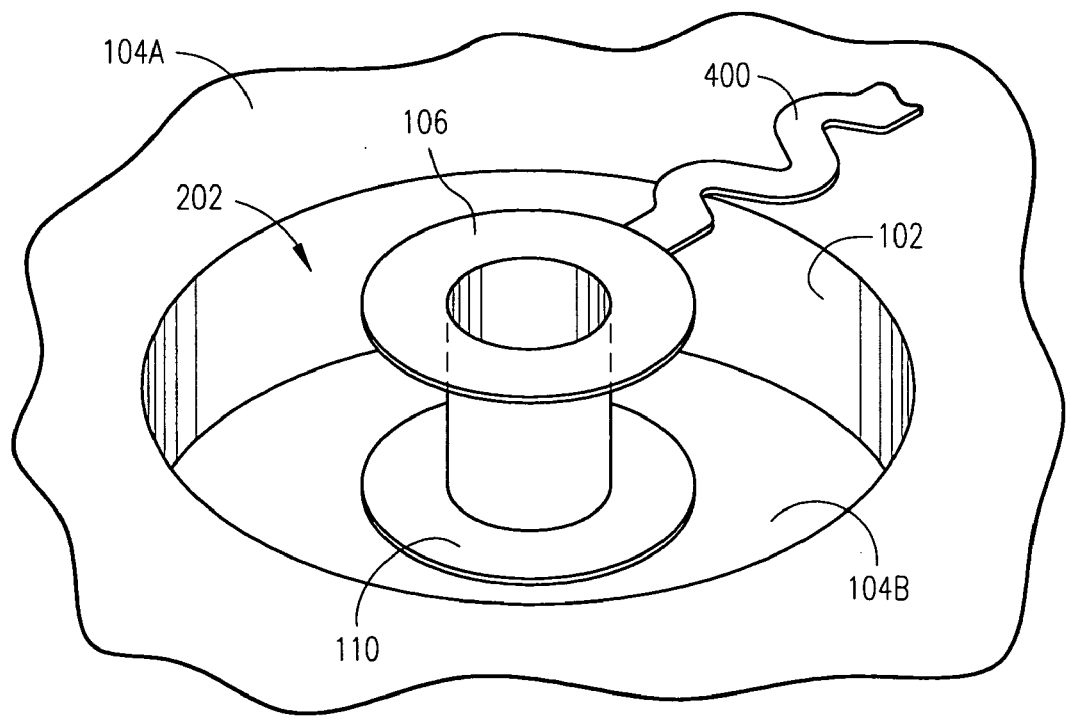
FIG. 4 is a perspective view illustrating a portion of a circuit board laminate including a conductive via and a non-linear trace.

FIG. 4 is a perspective view of the via 106 surrounded by the channel 202. A non-linear trace 400 extends between the via 106 and the conductive layer 104A. The non-linear trace 400 spans the channel 202 and provides electrical communication between the conductive layers 104A, 104B along with the via 106. Expansion of the insulating layers 102, even with the channel 202 can still cause stress along the linear trace 108 (FIGS. 1 and 4). The linear trace 108 is put in tension by the insulating layers 102 during expansion. The insulating layers 102 move the conductive layer 104A with respect to the juncture between the via 106 and the trace 108. The linear trace 108 is pulled by both the via 106 and conductive layer 104A. Enough stress may separate the linear trace 108 from the via 106 or conductive layer 104A, thereby severing electrical communication between the conductive layers 104A, 104B.

The non-linear trace 400 has sufficient flexibility to remain coupled between the conductive layer 104A and the via 106. The non-linear geometry of the trace 400 allows the trace 400 to expand when in tension without separating from the conductive layer 104A or the via 106. In one example, the trace 400 has a corrugated geometry. As the trace 400 is pulled between the via 106 and the conductive layer 104A the corrugations of the trace 400 extend and the trace 400 remains coupled to the via 106 and the conductive layer 104A. In another example, the trace 400 includes but is not limited a curved, spiraled, zig-zag, serpentine or other geometry.

Figure 5:
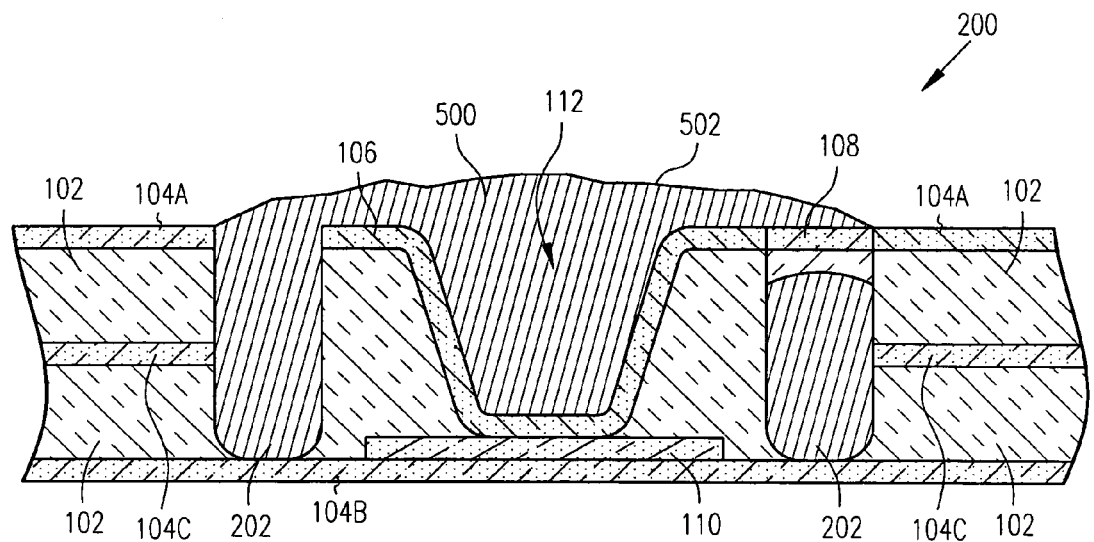
FIG. 5 is a sectional view illustrating a portion of a circuit board laminate including a filler material disposed in the channel.

FIG. 5 is a sectional view of the laminate 200 including the channel 202. The channel 202 and the cavity 112, in one example, are filled with a filler 500. The filler 500, in another example, fills the entirety of the channel 202 and the cavity 112. The upper surface 502 of the filler 500 is coplanar with the conductive layer 104A in yet another example. As shown in FIG. 5, the upper surface 502 of the filler 500 extends above the plane of the conductive layer 104A. The filler 500 provides a cover for the channel 202 and the cavity 112 and substantially prevents contaminants and the like from lodging within the channel and/or cavity 112. In one example, the filler 500 is a pliable material having a lower Young's modulus than that of the via 106, insulating layers 102 or conductive layers 104A–C. Examples of the filler 500 include, but are not limited to, silicone, epoxy or the like. When disposed in the channel 202, during expansion of the insulating layers 102 the filler 500 includes at least a portion that moves with the insulating layers 102 and the conductive layers 104A–C and another portion that remains substantially stationary with the via 106. As a result the filler 500, in one example, is sufficiently pliable to stretch and move with expansion of the laminate 200 to remain coupled around the via 106 and coupled to the insulating layers 102 and conductive layers 104A–C.

In another example, the filler 500 includes a more rigid material, for example copper, silicon filled epoxy, acrylic or the like. The filler 500 is coupled to the conductive layers 104A–C, insulating layers 102 and the via 106, in one example. Where the filler 500 is conductive (e.g. a copper paste), sufficient clearance is provided between the filler 500 and the via 106 and/or the conductive layers 104A–C to prevent shorting across the filler 500. In another example, the filler 500 is sufficiently rigid to secure the coupling between at least one of the conductive layers 104A, 104B and the via 106. As a result the filler 500 provides a rigid buffer that restrains expansion of the insulating layer 102 around the channel 202. Restraining the expansion of the insulating layers 102 allows the via 106 to remain coupled to the pad 110. The stresses caused by the insulating layers 102 expanding are substantially mitigated by the buffer created with the rigid filler 500. Additionally, the filler secures the trace 108 extending between the via 106 and the conductive layer 104A, in one example. As shown in FIG. 5, at least a portion of the filler 500 is disposed above the trace 108. The filler 500 is sufficiently rigid to restrain expansion of the insulating layers 102 that apply stress to the trace 108, in another example. The filler 500 substantially prevents separation of the trace 108 from contact with the via 106 and/or the conductive layer 104A, in yet another example.

Figure 6:
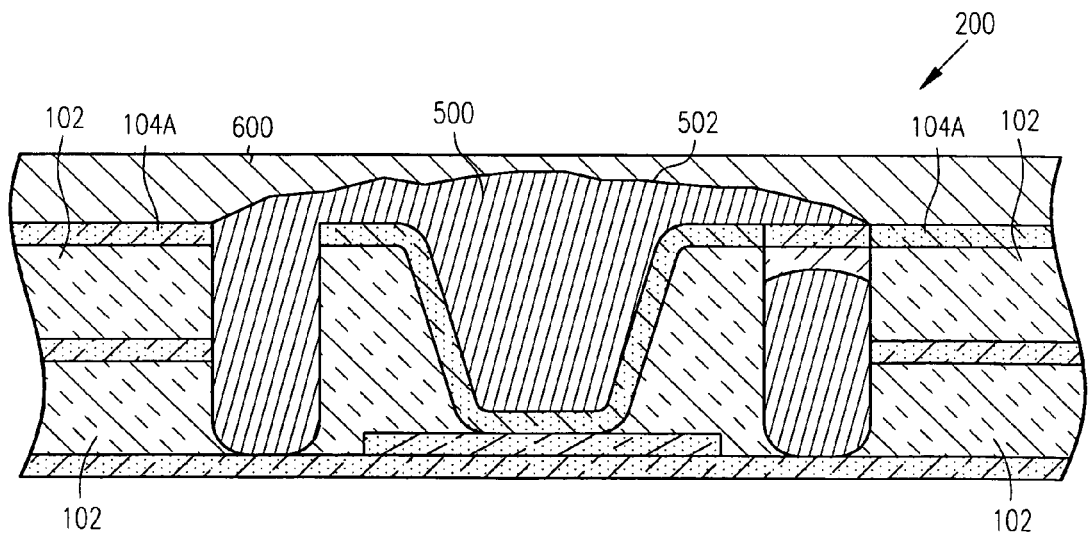
FIG. 6 is a sectional view illustrating a portion of a circuit board laminate including a sealant disposed over the circuit board.

FIG. 6 is a sectional view of the laminate 200 including a filler 500 and a sealant 600. In the example described above with an upper surface 502 of the filler 500 disposed over the plane of the conductive layer 104A, the sealant 600 is applied over the conductive layer 104A and the filler 500 and defines a planar surface for the laminate 200. In another example, the sealant 600 defines a non-planar surface. The sealant 600 substantially separates the other components of the laminate 200 from exposure to environmental conditions such as moisture, contaminants or the like. In one example, the sealant 600 substantially prevents ingress of moisture to the insulating layers 102 and expansion of the insulating layers 102 because of moisture absorption. The sealant 600 includes, but is not limited to epoxy and acrylic solder masks or the like. The sealant material, in an example, is applied as a liquid and cured with heat to form the sealant 600.

Figure 7:
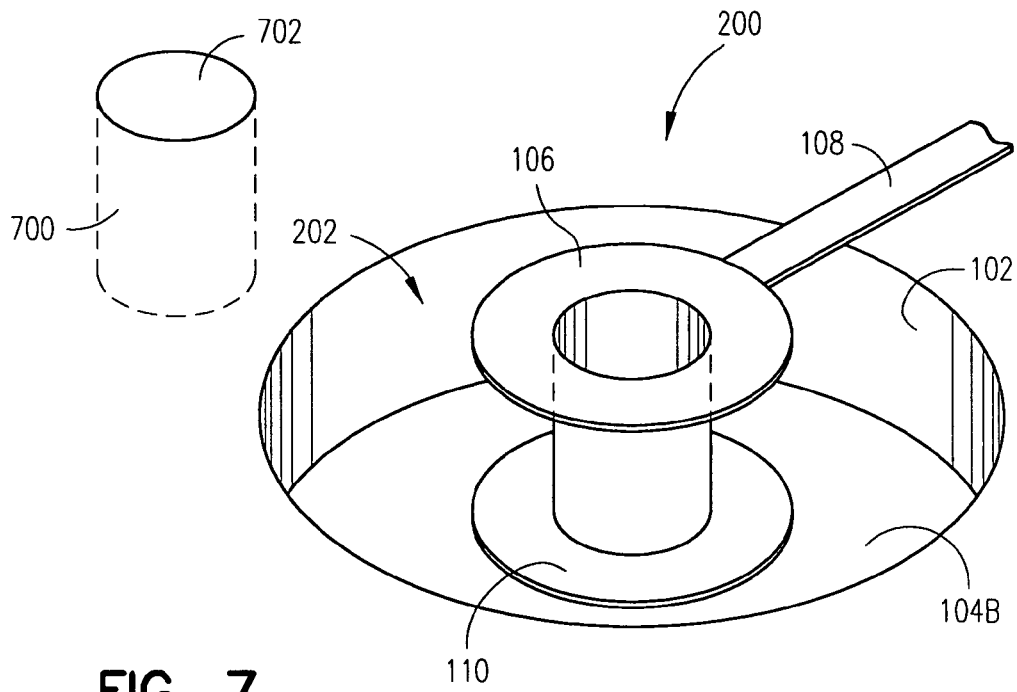
FIG. 7 is a perspective view illustrating a portion of a circuit board laminate including a conductive via and an adjacent opening containing a securing filler.

FIG. 7 is a perspective view of the laminate 200 including the channel 202 and an opening 700. In one example, the opening 700 is substantially adjacent to the via 106 and the channel 202. The opening extends at least part way through the insulating layers 102. The opening 700, in another example is filled with an anchoring filler 702. The anchoring filler 702 couples with at least the insulating layers 102. The anchoring filler 702, in yet another example is sufficiently rigid to restrain expansion of the insulating layers 102 substantially adjacent to the via 106. The anchoring filler 702, includes but is not limited to copper, cements or the like. As a result, the anchoring filler 702 in combination with the channel 202 provides enhanced protection for the coupling between the via 106 and the pad 110. The channel 202 isolates the via 106 from expansion of the insulating layers 102, and the anchoring filler 702 in the opening 700 restrains expansion of the insulating layers 102 around the channel 202. In another example, multiple openings 700 are disposed around the channel 202. The openings 700 are filled with the anchoring filler 702 to provide additional restraint of expansion of the insulating layers 102.

Figure 8:
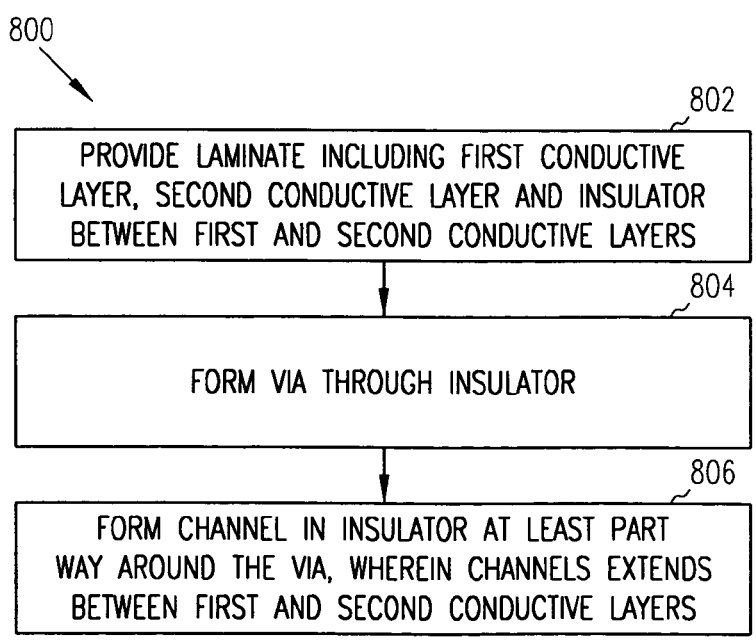
FIG. 8 is a block diagram illustrating a method for making a circuit board laminate.

FIG. 8 is a block diagram illustrating a method 800 for making a laminate, such as the laminate 200 shown in representative FIG. 2. In one example, the laminate 200 is a printed circuit board. At 802 a laminate 200 is provided including first and second conductive layers 104A, 104B. An insulator, for instance, insulating layer 102 is disposed between the first and second conductive layers 104A, 104B. At 804, a via 106 is formed through the insulator.

At 806, a channel 202 is formed in the insulator at least part way around the via 106. Forming the channel 202 includes, in one example, disposing a mask (e.g. a copper sheet or photo mask) over the laminate. The mask includes an opening that substantially corresponds to an outer perimeter of the channel 202. Forming the channel 202 further includes, in another example, removing at least a portion of the insulator under the opening. The insulator under the opening is removed with, for instance, a chemical etch, laser machining, plasma etching or the like. Forming the channel 202 leaves the first and second conductive layers 104A, 104B substantially unchanged under the opening. When plasma etching is used, in one example, the plasma etch does not affect the conductive layers 104A, 104B. The channel 202 extends between the first and second conductive layers 104A, 104B. In one example, the channel 202 extends completely between the first and second conductive layers 104A, 104B.

In another example, the channel 202 is filled with a pliable filler 500 (see FIG. 5), for instance silicone or epoxy. In yet another example, a filler 500 is disposed within the channel 202 to securely couple at least one of the first and second conductive layers 104A, 104B to the via 106. Optionally, a sealant 600 (see FIG. 6) is disposed on the laminate.

In yet another example, the method 800 includes acts for testing the contacts between the via 106 and at least one of the first and second conductive layers 104A, 104B. The laminate 200 is exposed to a dye. The laminate 200 is then exposed to a vacuum. In one example, the vacuum removes air within a crack, such as gap 114, between a pad 110 and the via 106 (see FIG. 1). The vacuum draws the dye into the gap 114 via capillary action. The laminate 200 is then dried, for example, at 100 degrees Celsius for 30 minutes. The via 106 is extracted from the laminate 200. In one example, a wire is secured to the via (e.g. by soldering) and the wire is pulled to extract the via 106. At least the via 106 and/or first and second conductive layers are examined for the presence of dye. In one example, the dye is disposed on the via 106 and/or conductive layers 104A, 104B corresponding to the gap 114.

Figure 9:
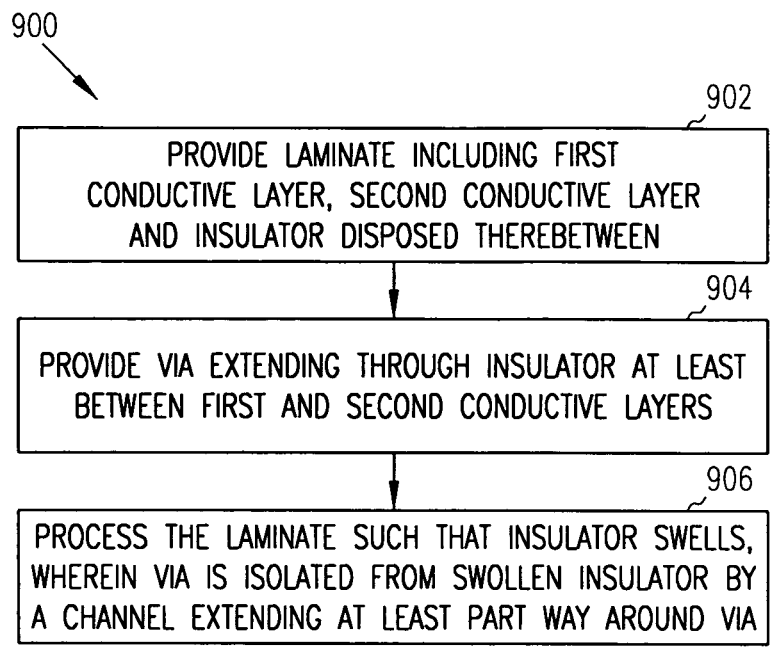
FIG. 9 is a block diagram illustrating a method for processing a circuit board laminate to avoid loss of contact between the conductive via and a pad.

FIG. 9 is a block diagram illustrating a method 900 for processing a circuit board to avoid loss of contact between a via 106 and at least one of first and second conductive layers 104A, 104B. FIG. 2 provides a representative example of the via 106 and conductive layers 104A, 104B. At 902, a laminate 200 is provided including first and second conductive layers 104A, 104B. An insulator, such as insulating layer 102 is disposed therebetween. At 904, a via 106 is provided that extends through the insulator at least between the first and second conductive layers 104A, 104B. At 906, the laminate 200 is processed such that the insulator swells. In one example, the laminate 200 is heated. In another example, the laminate 200 is heated to above about 240 to 250 degrees Celsius. In yet another example, processing the laminate 200 includes exposing the laminate to at least one cleaning solution (e.g. an acetone, alcohol or the like). Processing the laminate 200 includes, optionally, absorbing moisture in at least the insulator. In another example, processing the laminate 200 includes swelling an adhesive between the insulator and at least one of the first and second conductive layers 104A, 104B. Processing the laminate 200 includes, in still another example, swelling the insulator in a substantially perpendicular direction to a plane defined by a surface of at least one of the first and second conductive layers 104A, 104B. In another option, the insulator swells substantially perpendicular to a plane of fibers 116 (FIG. 1) within the insulator. The via 106 is isolated from the swollen insulator by a channel 202 extending at least part way around the via 106. A pliable filler 500 (see FIG. 5) is disposed within the channel 202 in another example. Processing the laminate, includes at least a portion of the pliable filler 500 moving with the insulator and at least another portion of the pliable filler 500 remaining substantially stationary with the via 106.

Figure 10:
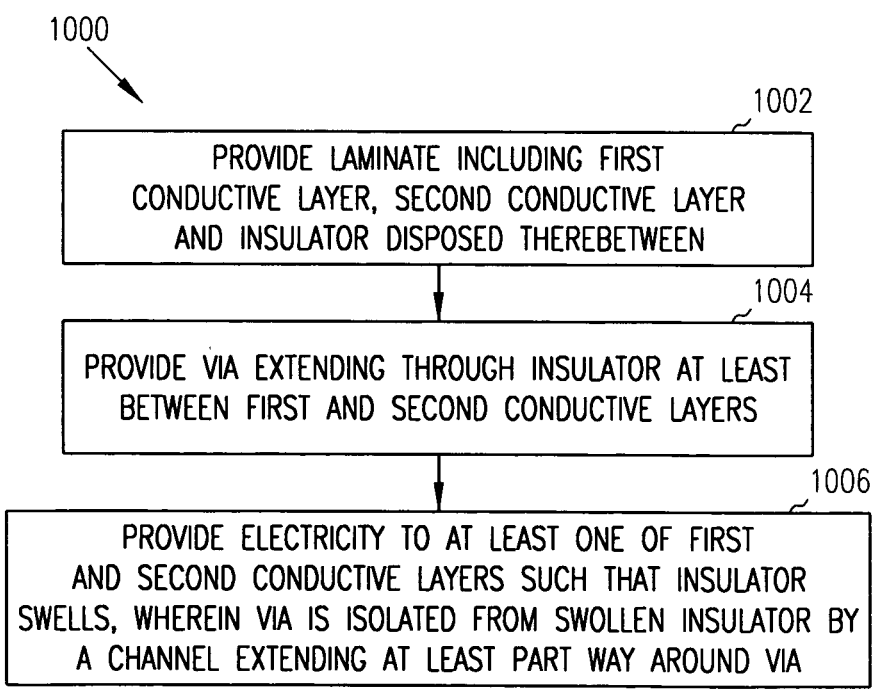
FIG. 10 is a block diagram illustrating a method for cycling electricity in a circuit board laminate to avoid loss of contact between the conductive via and a pad.

FIG. 10 is a block diagram illustrating a method 1000 for cycling power in the laminate 200 such that a via 106 remains in contact with conductive layers 104A, 104B. Laminate 200, the via 106 and conductive layers 104A, 104B are shown in representative FIG. 2. At 1002, the laminate 200 is provided and includes at least first and second conductive layers 104A, 104B and an insulator (e.g. insulating layer 102) disposed therebetween. At 1004, a via 106 is provided through the insulator between at least the first and second conductive layers. At 1006, electricity is provided to at least one of the first and second conductive layers 104A, 104B such that the insulator swells, for instance, because of heat within the conductive layers 104A, 104B. The via 106 is isolated from the swollen insulator by a channel 202 extending at least part way around the via 106. A pliable filler, for example filler 500 (FIG. 5) is disposed within the channel 202. In one example, where electricity is provided to at least one of the first and second conductive layers 104A, 104B, at least a portion of the pliable filler 500 moves with the insulator and at least another portion of the pliable filler 500 remains stationary with the via 106.

It is to be understood that the above description is intended to be illustrative, and not restrictive. Many other embodiments will be apparent to those of skill in the art upon reading and understanding the above description. It should be noted that embodiments discussed in different portions of the description or referred to in different drawings can be combined to form additional embodiments of the present application. The scope of the invention should, therefore, be determined with reference to the appended claims, along with the full scope of equivalents to which such claims are entitled.

What is claimed is:

1. A laminate comprising:
   a first conductive layer;
   a second conductive layer disposed over the first conductive layer;
   an insulator disposed between the first conductive layer and the second conductive layer;
   a conductive via extending through the insulator and electrically connecting the first and second conductive layers, at least one conductive trace electrically connects the via to at least one of the first and second conductive layers, and the at least one conductive trace extends non-linearly between the via and at least one of the first and second conductive layers; and
   a channel in the insulator, the channel extending far enough around the via and far enough into the insulator to reduce mechanical stress on the electrical connection between the via and at least one of the first and second conductive layers due to swelling of the insulator, the mechanical stress reduced enough to preserve electrical connectivity of the first and second conductive layers by the via in spite of the swelling.

2. The laminate of claim 1, wherein the laminate includes a flexible circuit board.

3. The laminate of claim 1, wherein the conductive via includes a plated hollow conductive via.

4. The laminate of claim 1, wherein the conductive via is coupled along at least a portion of the insulator.

5. The laminate of claim 1, wherein the insulator includes a polymer.

6. The laminate of claim 1, the channel continuously extending at least part way around the via.

7. An apparatus comprising:
   an electronic device, the electronic device including:
   a flexible circuit including:
      a first conductive layer;
      a second conductive layer disposed over the first conductive layer;
      an insulator disposed between the first conductive layer and the second conductive layer;
      a hollow conductive via extending through the insulator and electrically connecting the first and second conductive layers, wherein the conductive via is coupled along at least a portion of the insulator, and at least one conductive trace electrically connects the via to at least one of the first and second conductive layers; and
      a channel in the insulator, the channel extending at least part way around the via, wherein the channel extends at least part way between at least the first and second conductive layers.

8. The apparatus of claim 7, wherein the electronic device is an implantable medical device.

9. The apparatus of claim 7, wherein the electronic device is an external device for communicating with an implantable medical device.

10. The apparatus of claim 7, wherein the channel extends between the first and second conductive layers.

11. The laminate of claim 7, wherein the channel includes an etched channel.

12. The laminate of claim 7, the channel continuously extending at least part way around the via.

13. A laminate comprising:
   a first conductive layer;
   a second conductive layer disposed over the first conductive layer;
   an insulator between the first conductive layer and the second conductive layer;
   a hollow conductive via extending through the insulator and electrically connecting the first and second conductive layers, wherein the conductive via is coupled along at least a portion of the insulator, and at least one conductive trace electrically connects the via to at least one of the first and second conductive layers; and
   a channel in the insulator, the channel extending at least part way around the via, wherein the channel extends at least part way between at least the first and second conductive layers.

14. The laminate of claim 1 wherein the at least one trace extends non-linearly between the via and at least one of the first and second conductive layers.

15. The laminate of claim 1 wherein the at least one trace bridges the channel.

16. The laminate of claim 1, wherein the channel surrounds the via.

17. The laminate of claim 1, wherein the channel extends between the first and second conductive layers.

18. The laminate of claim 1, wherein the laminate includes a flexible circuit board.

19. The laminate of claim 1, wherein the insulator includes a polymer.

20. The laminate of claim 1, wherein the channel includes an etched channel.

21. The laminate of claim 1, the channel continuously extending at least part way around the via.

22. The laminate of claim 1, further comprising a pliable filler in the channel.

23. The laminate of claim 22, wherein the filler includes silicone.

24. The laminate of claim 1, further comprising a filler in the channel to help secure at least one of the first and second conductive layers to the via.

25. The laminate of claim 24, wherein the filler includes copper.

26. The laminate of claim 1, further comprising an opening extending through at least the first conductive layer and the insulator, wherein the opening is substantially adjacent to the channel.

27. The laminate of claim 26, further comprising a filler disposed within the opening to help secure at least one of the first and second conductive layers to the via.

* * * * *

UNITED STATES PATENT AND TRADEMARK OFFICE
CERTIFICATE OF CORRECTION

PATENT NO. : 7,205,486 B2  
APPLICATION NO. : 10/892648  
DATED : April 17, 2007  
INVENTOR(S) : Primavera et al.

It is certified that error appears in the above-identified patent and that said Letters Patent is hereby corrected as shown below:

On the Title page, in "Primary Examiner", in column 2, line 1, delete "Pizarro" and insert -- Pizarro-Crespo --, therefor.

In column 8, line 65, in Claim 14, delete "claim 1" and insert -- claim 13, --, therefor.

In column 9, line 1, in Claim 15, delete "claim 1" and insert -- claim 13, --, therefor.

In column 9, line 3, in Claim 16, delete "claim 1" and insert -- claim 13 --, therefor.

In column 9, line 5, in Claim 17, delete "claim 1" and insert -- claim 13 --, therefor.

In column 9, line 7, in Claim 18, delete "claim 1" and insert -- claim 13 --, therefor.

In column 9, line 9, in Claim 19, delete "claim 1" and insert -- claim 13 --, therefor.

In column 9, line 11, in Claim 20, delete "claim 1" and insert -- claim 13 --, therefor.

In column 9, line 13, in Claim 21, delete "claim 1" and insert -- claim 13 --, therefor.

In column 9, line 15, in Claim 22, delete "claim 1" and insert -- claim 13 --, therefor.

In column 10, line 3, in Claim 24, delete "claim 1" and insert -- claim 13 --, therefor.

In column 10, line 8, in Claim 26, delete "claim 1" and insert -- claim 13 --, therefor.

Signed and Sealed this

Fourteenth Day of August, 2007

JON W. DUDAS  
*Director of the United States Patent and Trademark Office*